United States Patent [19]

Doty et al.

[11] 4,448,811

[45] May 15, 1984

[54] OXIDIZING AGENT FOR ACIDIC ACCELERATOR IN ELECTROLESS METAL PLATING PROCESS

[75] Inventors: Warren R. Doty, Los Alamos, N. Mex.; Timothy J. Kinney, Berkley, Mich.

[73] Assignee: OMI International Corporation, Warren, Mich.

[21] Appl. No.: 505,133

[22] Filed: Jun. 16, 1983

Related U.S. Application Data

[63] Continuation-in-part of Ser. No. 335,780, Dec. 30, 1981, abandoned.

[51] Int. Cl.³ .............................................. C23C 3/02
[52] U.S. Cl. .................................. 427/304; 156/668; 427/305; 427/306; 427/307
[58] Field of Search ............................... 427/304–306, 427/307; 156/668

[56] References Cited

U.S. PATENT DOCUMENTS

| | | | |
|---|---|---|---|
| 3,011,920 | 12/1961 | Shipley | 427/304 |
| 3,513,015 | 5/1970 | Fitzpatrick | 427/306 |
| 3,962,497 | 6/1976 | Doty et al. | 427/306 |
| 4,035,227 | 7/1977 | Doty et al. | 427/307 |
| 4,204,013 | 5/1980 | Arcilesi | 427/304 |

*Primary Examiner*—John D. Smith
*Attorney, Agent, or Firm*—Richard P. Mueller

[57] ABSTRACT

A process for treating a polymeric plastic substrate to render it receptive to electroless plating in a process of the type including the steps of etching the substrate and activating the etched substrate. The present improvement includes the step of accelerating the activated substrate with an improved aqueous accelerating solution containing an aqueous soluble compatible oxidizing agent present in an amount effective to increase the activity of the accelerating solution. The improved accelerating solution inhibits the plating of stop-off coatings and plating racks and is of versatile use.

12 Claims, No Drawings

OXIDIZING AGENT FOR ACIDIC ACCELERATOR IN ELECTROLESS METAL PLATING PROCESS

This application is a continuation-in-part of our earlier application Ser. No. 335,780, filed Dec. 30, 1981 now abandoned.

BACKGROUND OF THE INVENTION

This invention relates to a method of treating polymeric substrates to render them receptive to electroless plating, and more particularly to a method of accelerating polymeric substrates using an aqueous soluble oxidizing agent. Reference may also be made to copending application Ser. No. 335,935, now abandoned filed Dec. 30, 1981, and entitled "Method of Accelerating Polymeric Substrates Using Oxidizing Metal Ions and Alkyl Amines". That application is owned by the same assignee as the present invention and generally relates to the use of an accelerating solution which includes an oxidizing metal ion, a substituted alkyl amine, and a material selected from the group consisting of a mineral acid, an aqueous soluble salt or said substituted alkyl amine, and an aqueous soluble salt of a mineral acid, as well as mixtures thereof. The disclosure of that application is hereby incorporated herein by reference.

A variety of methods have heretofore been used or proposed for use in applying metallic platings to all or portions of the surfaces of polymeric plastic parts. Such processes conventionally comprise a plurality of sequential pre-treatment steps to render the plastic substrate receptive to the application of electroless plating whereafter the plated part can be processed through conventional electroplating operations to apply one or a plurality of supplemental metallic platings over all or selected portions of the plastic substrate. Conventionally, the pre-treatment steps employed include a cleaning or series of cleaning steps, if necessary, to remove surface films or contaminating substances, followed thereafter by an aqueous acidic etching step employing a hexavalent chromium solution to achieve a desired surface roughess or texture enhancing a mechanical interlock between the substrate and the metallic plating to be applied thereover. The etched substrate is subjected to one or a plurality of rinse treatments to extract and remove any residual hexavalent chromium ions on the surfaces of the substrate which may also include a neutralization step including reducing agents to substantially convert any residual hexavalent chromium ions to the trivalent state. The rinsed etched substrate is thereafter typically subjected to an activation treatment, such as in an aqueous acidic solution containing a tin-palladium complex, for example, to form active sites on the surface of the substrate, followed by one or more rinsing steps after which the activated surface is typically subjected to an accelerating treatment in an aqueous solution to extract any residual activator constituents or compounds on the surface of the substrate. The accelerated plastic part is again water rinsed and thereafter is subjected to an electroless plating operation of any of the types known in the art to apply a metallic plate such as copper, nickel, or cobalt over all or certain selected areas thereof whereafter the part is rinsed and thereafter is subjected to conventional electroplating operations.

Typical of such plastic plating processes are those described in U.S. Pat. Nos. 3,011,920; 3,532,518; 3,622,370; 3,961,109; 3,962,497; and 4,204,013; to which reference is made for further details of the processes, and the disclosures of which are hereby incorporated by reference. The present invention is also applicable to processes of the foregoing type and is specifically directed to an improved aqueous accelerating solution which provides benefits and advantages heretofore unattainable in accordance with prior art practices.

A continuing problem associated with the electroplating of polymeric substrates has been in the careful control of the activation and accelerating steps to achieve a plastic substrate which is receptive to the subsequent electroless plating solution to provide 100% coverage of a conductive metal layer which is adherent to the substrate and which is devoid of any lack of continuity of coverage or "skipping". The presence of such discontinuities or skips results in plastic parts which upon subsequent electroplating contain non-plated areas or non-uniformity in the metallic plating deposit rendering them unsuitable for the intended use.

In the commercial decorative plating of ABS or other plastic parts, there are several reasons why it is often desirable that some areas of the plastic surface remain unplated: (1) to enhance the decorative appearance of the part as in the case of decorative painting; (2) for economic reasons as in not wasting valuable metal and plating solutions on areas of the surface that will be invisible when the part is mounted or otherwise incorporated into a final assembly for use; (3) to maintain electrically non-conducting areas for insulation; and (4) to maintain non-plated areas for final fastening assembly such as ultrasonic welding of ABS. Prevention of plating is accomplished by selectively coating certain areas of the part with an electrically nonconductive stop-off paint prior to processing the part through electroless metallizing and conventional electroplating. Any of the commercially available stop-off compositions such as Perry & Derrick Lectro Bloc 73310 Black Stop-Off Paint, can be employed for this purpose. The formulation of these stop-off paints or coatings is intended to be such that they will not be activated and electrolessly metallized in subsequent processing steps. In practice, however, it is often the case that, due to improper use or application, or even due to the chemical composition of the stop-off coating, certain portions of such painted areas will absorb sufficient activating species to coatings has been found to be a problem in view of the varying degrees to which palladium from the tin-palladium activator is absorbed on these various coatings. For example, some coatings absorb only a small amount of palladium which will subsequently be removed during acceleration. However, other coatings absorb larger amounts of palladium which are not removed during subsequent acceleration. The obvious result in the latter case is the undesirable plating of areas coated with stop-off paint.

It should be noted that polymeric substrates which have been activated such as with a tin-palladium complex, for example, are not thereafter ready for electroless plating. The film formed on the polymeric substrate during immersion in the activator solutions will not effectively function as a catalyst and induce electroless plating until it is accelerated, which in the case of a tin-palladium activator, for example, is not until the stannous chloride also present in the substrate is removed. This is done by "accelerating" the substrate surface. Acceleration is accomplished by contacting the activated polymeric substrate with materials such as mineral acids which catalyze hydrolysis. In the case of a tin-palladium activator, for example, it is the hydrolysis of stannous chloride that is catalyzed. Although such treatment may also remove a small amount of the activator constituents such as palladium, a sufficient amount of accelerated residual material remains on the substrate surface for the subsequent electroless plating steps.

The possibilities for controlling the activity or strength of most accelerators and thereby overcoming undesirable plating, as briefly referred to above, include increasing the amount of air agitation used, varying concentration, controlling operating temperatures, or varying the immersion time used. However, the degree to which these parameters can be varied in a large scale industrial production installation is limited. This consequently limits the degree of change in activity of the accelerators, and thus limits the efforts to prevent undesired plating.

The present invention overcomes these problems by allowing the activity of the accelerator to be varied significantly and therefore overcomes many of the problems and disadvantages associated with processes for the plating of plastic articles, and particularly the acceleration thereof, by providing a solution which will inhibit plating on stop-off paints and plating racks (such as those coated with polyvinyl chloride or various plastisols and organisols), and which is of versatile use on a variety of conventional platable plastic materials.

SUMMARY OF THE INVENTION

The benefits and advantages of the present invention are achieved by a process in which a polymeric plastic substrate is treated to render it receptive to electroless plating and includes the steps of etching the plastic substrate with an aqueous acid solution containing hexavalent chromium ions and also activating the etched substrate. In accordance with the present invention, the activated substrate is subsequently accelerated with an aqueous accelerating solution which includes an aqueous soluble compatible oxidizing agent present in an amount effective to increase the activity of the accelerator solution. The accelerated substrate may then be given a water rinse making it ready for conventional electroless plating, which may be followed by one or more conventional electroplating steps. Of course, conventional rinsing steps may be utilized after the above-referenced etching and activation steps.

It has surprisingly been found that the use of controlled concentrations of oxidizing agents, such as chromic acid, hydrogen peroxide, potassium iodate, potassium meta-periodate, ammonium persulfate, vanadium pentoxide, or iodine in conventional acidic accelerators is an effective method for making such accelerating solutions sufficiently more aggressive to assure the removal of activating species which have been absorbed on stop-off painted areas and/or plating racks. For each such oxidizing agent there are ranges or concentrations, which are partially dependent on the operating parameters of other solutions in the processing cycle, within which no overplating of stop-off painted areas or plating racks occurs while yet complete coverage by electroless metallization of the exposed plastic surfaces is allowed. In any event, the oxidizing agents are used in an amount and within parameters where the activity of the accelerator solution is increased sufficiently to prevent undesired plating of the type referred to hereinabove.

The process employing the improved accelerating solution of the present invention can generally be performed at concentrations ranging from about 0.1 to about 300 gm/L, of course, as noted above, depending upon the oxidizing agent used. Temperatures of from about room temperatures up to about 160° F. are also generally satisfactory, again depending upon the particular oxidizing agent. Time periods of from about 5 seconds up to about 5 minutes are usually satisfactory, but contact time will vary depending upon the type of plastic substrate, the degree of activation thereof, the temperature of the activating solution and other related variables. The accelerating solution is generally operated in the acidic range of pH from pH=0 up to about neutral, but preferably at a pH of less than about 1.

Additional benefits and advantages of the present invention will become apparent upon a reading of the detailed description of the preferred embodiments taken in conjunction with the accompanying examples.

DESCRIPTION OF THE PREFERRED EMBODIMENTS

The process of the present invention is applicable for use with any of the various platable plastic or polymeric plastics including acrylonitrile-butadiene-styrene (ABS), polyaryl ethers, polyphenylene oxide, nylon, and the like. The polymeric plastic parts are usually subjected to a cleaning treatment to remove any surface contamination which may further include an organic solvent treatment, in some instances, to render the substrate hydrophilic during the subsequent chrome acid etching step. Usually the cleaning step is performed employing an aqueous alkali soak solution followed by contact in an organic solvent medium which may comprise either a single-phase system or an aqueous organic solvent emulsion. The clean part is thereafter thoroughly water rinsed and is next subjected to an etching treatment in an aqueous acid solution containing hexavalent chromium ions or a mixture of hexavalent chromium ions and acid, such as sulfuric acid, to effect an etching of the surface thereof. The specific concentration of the etching solution, the temperature, and the duration of treatment will vary depending upon the specific type of plastic substrate and the parameters of the etching step are, accordingly dictated by procedures well known and practiced in the art.

Following the etching step, the etched polymeric substrate is subjected to one or more cold water rinses and may additionally include a neutralization step employing an aqueous solution containing a reducing agent to effect a reduction of any residual contaminating hexavalent chromium ions to the trivalent state. A typical neutralization treatment is described in U.S. Pat. No. 3,962,497, the teachings of which are incorporated herein by reference. Following neutralization, if employed, the substrate is again water rinsed and thereafter is subjected to an activation treatment employing an aqueous acid solution which may contain a tin-palladium complex of the various types well know in the art. A typical one-step activation treatment is described in U.S. Pat. No. 3,011,920 and U.S. Pat. No. 3,532,518, the substance of which are incorporated herein by reference. Of course, other activator solutions may also be used with the present invention, including those which contain no noble metals or are based on common or non-precious metals.

Following the activation treatment, the activated polymeric substrate is subjected to one or a series of separate cold water rinse treatments whereafter it is subjected to acceleration in an aqueous solution in accordance with the practice of the present invention as more fully hereinafter to be described. Following acceleration, the part is cold water rinsed and thereafter is subjected to an electroless plating process to apply a conductive, continuous, and adherent metallic plate such as copper, nickel, or cobalt over all or selected surface areas thereof. The electroless plating step is performed in accordance with well know and established practices employing an aqueous solution containing a reducing agent and a reducible salt of the metal to be deposited on the surface. Following the electroless plating step, the part is subjected to one or a plurality of water rinse treatments and thereafter can be electroplated by employing normal procedures to apply one or a plurality of overlying plate on the polymeric substrate if so desired.

In order to achieve selective plating of only certain areas of polymeric plastic articles, and as noted above, it is conventional either prior to or following the cleaning step to apply a stop-off coating, of the type commercially available, to those areas which are not to be plated. The present invention provides benefits in this regard by achieving proper acceleration of the plastic substrate to be plated while inhibiting or substantially completely eliminating plating on such stop-off areas. The present invention also provides similar benefits with regard to undesired plating on plating racks.

The accelerating solution of the present invention comprises an aqueous solution containing as its essential constituent an aqueous soluble compatible oxidizing agent in an amount effective to increase the activity of the conventional accelerating solution, with conventional acidic accelerating solutions such as those based on mineral acids or the like being suitable. The oxidizing agent added according to the present invention may be further characterized as being compatible with the activator constituent or the like on the plastic surface as well as with the polymeric material itself. The concentration of the oxidizing agent should be chosen so as to be controllable and useful in increasing the activity of the acceleration, but yet preventing oxidation of any significant amount of the activator catalyst or the like on the activated substrate.

Typical of oxidizing agents which are suitable for use in the practice of the present invention are chromic acid, hydrogen peroxide, potassium iodate, potassium meta-periodate, ammonium persulfate, vanadium pentoxide, and iodine, as well as mixtures thereof. Tupical usable concentration levels, which will be detailed further hereinbelow, range from about 0.1 to about 300 mg/L.

In accordance with a further preferred embodiment of the present invention, the accelerating solution may contain a controlled amount of a surfactant to increase uniformity of reaction with the substrate achieving a more uniform acceleration thereof. Surfactants suitable for use include any of those well known in the art which are compatible with the other bath constituents. Such surfactants, when employed, can be used in amounts of from about 0.01 up to about 6 g/L.

The accelerating solution can be employed at temperatures ranging from about room temperatures (65° F.) to temperatures below the boiling point of the solution. Ordinarily, the accelerating solution is contained in treating tanks incorporating a protective plastisol lining and, for practical considerations, temperatures up to about 160° F. are employed to avoid any thermal degradation or decomposition of such protective linings. In accordance with a preferred practice, the aqueous accelerating solution is employed at temperatures ranging from about 65° to about 160° F., which provides for reasonable treating times consistent with the available operating cycle time of the continuous plating system.

The aqueous accelerating solution can be applied to the activated plastic substrate by any one of a variety of techniques of which immersing the plastic parts in the solution constitutes a preferred practice. Generally, immersion times from about 15 seconds up to about 30 minutes can be employed, while time periods ranging from about 30 second up to about about 5 minutes employing solutions at a temperature of about 65° to 160° F. are satisfactory for most plastic materials and part configurations. The specific time period will vary somewhat depending upon the nature of the plastic material, the particular oxidizing agent used and its degree of activation of the polymeric substrates, as well as the temperature of the solution. Typically, for ABS type plastics, accelerating treatments of from about 30 seconds to about 90 seconds at temperatures of about 130° to about 150° F. are satisfactory.

In order to further illustrate the process of the present invention, the following examples are provided for illustrative purposes and are not intended to be limiting of the scope of the invention as herein described and as set forth in the subjoined claims.

EXAMPLES

A series of test panels of a nominal size of about 3 inches by about 4 inches by 1/10th inch thick, comprised of a platable ABS plastic were subjected to a pretreatment and electroless plating as hereinafter described. The panels were comprised of an ABS plastic commercially available under the designation PG 299 from Monsanto Chemical Company.

After appropriate cleaning, each of the panels was partially coated with Perry & Derrick Lectro Bloc 73320 Black Stop-Off Paint which had been thinned 20% by volume with toluene. The panels were air dried and then over cured for one hour at a temperature of about 122° F.

The plastic panels were then etched in an aqueous acid solution containing 356 g/L chromic acid, 412 g/L sulfuric acid, and 0.2 g/L of a perfluorinated proprietary wetting agent commercially available under the designation FC-98 from Minnesota Mining and Manufacturing Company. The panels were immersed for a period of six minutes in the aqueous etching solution maintained at about 150° F. while undergoing an air agitation. At the conclusion of the etching treatment, the panels were removed and cold water rinsed with tap water for a period of about 2 minutes. The rinsed parts were thereafter neutralized in a chromium reducing neutralizer solution containing 18 g/L hydrochloric acid and 3 g/L hydroxyl amine sulfate. The neutralization treatment was carried out for two minutes with air agitation at a solution temperature of about 80° F.

After neutralization, the panels were cold water rinsed with tap water for about one minute and then were subjected to an activation treatment in an aqueous solution containing 0.077 g/L palladium, 9 g/L tin chloride, 35.2 g/L hydrochloric acid, and 192 g/L sodium chloride. An activation treatment of about one minute and 45 seconds at a solution temperature of about 65° F. was employed. Thereafter, the panels were cold water rinsed with tap water for about one minute and then were immersed in an accelerating solution consisting of 96 g/L sodium bisulfate, 20 g/L sodium chloride, and 3 g/L hydroxyl ammonium sulfate, hereinaftered referred to as "accelerator A". (Of course, other similar conventional accelerating solutions with similar properties, including those based on mineral acids or the like, may also be suitable in this regard.) The panels were accelerated for about 2 minutes with air agitation at a temperature of about 160° F.

After acceleration, the parts were again cold water rinsed and subjected to an electroless plating step to apply a nickel plate thereover employing an aqueous bath containing 12 g/L nickel chloride hexahydrate [$NaH_2PO_2.H_2O$], and 24 g/L citric acid. The electroless plating was performed at about 65° F. for a period of about 6 minutes.

The above procedure resulted in complete coverage of the exposed portion of the ABS panel, and almost complete coverage of that portion of the panel coated with the stop-off paint. In order to prevent and control such undesired plating coverage, the following further tests were conducted using the same procedure outlined above, except with the various modifications to the accelerating solution made in each instance and described hereinbelow:

EXAMPLE I

The addition of 1 mg/L chromium VI, obtained from an aqueous solution of chromic acid ($CrO_3$), to accelerator A resulted in only slight overplate of the stop-off paint, while complete electroless nickel coverage was maintained on the exposed ABS. At 2 mg/L chromium VI, no overplate occurred on the stop-off paint, and the exposed ABS was completely covered by electroless nickel. No skipping was noted on the ABS until a concentration of 5 mg/L chromium VI was reached.

EXAMPLE II

Panels were again prepared and processed as outlined above. However, in this series of tests, it was shown that the addition of hydrogen peroxide, $H_2O_2$, to accelerator A produced no overplate on stop-off paint at a concentration of about 50 mg/L while complete coverage of the exposed ABS was obtained. No skipping on the ABS was observed until a concentration of about 100 mg/L $H_2O_2$ was reached.

EXAMPLE III

Panels were prepared and processed as described above except in this case the additive to accelerator A was potassium iodate, $KIO_3$. Good results, i.e., no overplate on stop-off paint with complete coverage of ABS, was obtained between concentrations of 0.2 and 2.0 mg/L. Complete skipping on exposed ABS was not obtained until a concentration of 5 mg/L $KIO_3$ was reached.

EXAMPLE IV

Again, panels were prepared and processed as referred to above, but potassium meta-periodate, $KIO_4$, was added to accelerator A. This produced good results in a concentration range of from about 0.1 to about 1.0 mg/L, and did not produce skips on ABS until a concentration of 2.5 mg/L was reached.

EXAMPLE V

In this series of tests, incremental additions of ammonium persulfate, $(NH_4)_2S_2O_8$, were made to accelerator A while ABS panels prepared and processed as before were run. Overplating of the stop-off paint was completely eliminated at and above an ammonium persulfate concentration of 0.2 g/L. Only a very slight skip was observed along the stop-off line on the exposed ABS at a concentration of about 5.0 g/L.

EXAMPLE VI

Incremental additions of vanadium pentoxide, $V_2O_5$, were made to accelerator A and ABS panels prepared and processed as described before were tested. Good results were obtained between a vanadium V concentration of from about 5 mg/L to about 15 mg/L. Skips were observed on the exposed ABS at a vanadium V concentration of 20 mg/L.

EXAMPLE VII

Addition of 1 mg/L iodine to accelerator A produced skipping on exposed ABS when panels were prepared and processed as above with an activator time of 1 min. 45 sec. However, when the activator time was increased to 4 minutes, no skipping was observed until an iodine concentration of 20 mg/L was reached.

EXAMPLE VIII

Panels prepared and plated as detailed above and run through an acidic accelerator containing vanadium V ion as in Example IV, but with an activator time of 4 minutes, showed no skipping on exposed ABS until a vanadium V concentration of 35 mg/L was reached. Complete coverage of ABS was restored by decreasing the immersion time in the acidic accelerator from 2 minutes to 30 seconds.

EXAMPLE IX

Potassium permanganate, $KMnO_4$, was tested in the acidic accelerator at concentrations of 1, 2, 5 and 10 mg/L, with the remainder of the process being the same as described above. At 1, 2, and 5 mg/L, no beneficial effect was observed. At 10 mg/L a complete misplate was observed on both the painted area and the exposed ABS. It is concluded from this that the effective range for this material is narrow and would be difficult to control in practice.

EXAMPLE X

Additional aqueous accelerating solutions are prepared for use in a process for treating a polymeric plastic substrate to render it receptive to electroless plating, which process includes the steps of etching the substrate with an aqueous acid solution containing hexavalent chromium ions, activating the etched substrate, and accelerating the activated substrate. The aqueous accelerating solutions used contain an aqueous soluble compatible oxidizing agent present in an amount effective to increase the activity of the accelerating solution. Oxidizing agents selected from the group referred to and listed above and present in an amount of from about 0.1 to about 300 g/L are used. A substrate of the type referred to hereinabove is contacted with the accelerating solution for a period of time from about 15 seconds to about 30 minutes with the accelerating solution being maintained at a temperature of from about 65 to about 160° F. and a pH of from about 0 to about 7. Upon subsequent electroless plating, reduction or total elimination of plating on electroplating racks and stop-off coatings is observed.

As evidenced by the above-referenced examples, it should be apparent that the use of an improved accelerator solution in accordance with the teaching of the present invention provides improved control of the activity of accelerating solutions. A comparison of the solutions of examples I through VIII and the control solution, which did not contain an oxidizing agent, demonstrates the ability of an oxidizing agent to prevent plating on stop-off paints. In connection with these examples, reduction or total elimination of plating on stop-off paints was observed.

Among the advantages of the present invention in addition to those described hereinabove, is that by eliminating plating on the stop-off paint, a cost savings is realized by eliminating metal losses and by eliminating the need to remove the metal plating from the stop-off paint. In addition, undesired plating on electroplating racks is also preventable utilizing the present invention. Furthermore, the described solutions are of versatile use on a variety of conventional plastic materials.

While it will be apparent that the invention hereinabove disclosed is well calculated to achieve the benefits and advantages as hereinabove set forth, it will be appreciated that the invention is susceptible to modification, variation, and change without departing from the spirit thereof.

What is claimed is:

1. In a process for treating a polymeric plastic substrate to render it receptive to electroless plating including the steps of etching the substrate with an aqueous acid solution containing hexavalent chromium ions, activating the etched substrate, and accelerating the activated substrate, the improvement comprising contacting the activated substrate during the acceleration step with an aqueous accelerating solution containing an aqueous soluble compatible oxidizing agent present in an amount effective to increase the activity of the accelerating solution, which oxidizing agent is selected from the group consisting of chromic acid, potassium iodate, potassium meta-periodate, ammonium persulfate, vanadium pentoxide, and iodine, as well as mixtures thereof.

2. The process as defined in claim 1 in which said oxidizing agent comprises chromic acid in an amount of from about 1 to about 5 mg/L of chromium VI.

3. The process as defined in claim 1 in which said oxidizing agent comprises potassium iodate in an amount of from about 0.2 to about 5 mg/L.

4. The process as defined in claim 1 in which said oxidizing agent comprises potassium meta-periodate in an amount of from about 0.1 to about 2.5 mg/L.

5. The process as defined in claim 1 in which said oxidizing agent comprises ammonium persulfate in an amount of from about 0.2 to about 5.0 g/L.

6. The process as defined in claim 1 in which said oxidizing agent comprises vanadium pentoxide in an amount of from about 5 to about 20 mg/L of vanadium V.

7. The process as defined in claim 1 in which said oxidizing agent comprises iodine in an amount of from about 1 to about 20 mg/L.

8. The process as defined in claim 1 in which the substrate is contacted with said accelerating solution for a period of time of from about 15 seconds to about 30 minutes.

9. The process as defined in claim 1 in which said accelerating solution is maintained at a temperature of from about 65 to about 160° F.

10. The process as defined in claim 1 in which said accelerating solution has a pH of from about 0 to about 7.

11. The process as defined in claim 1 in which said accelerating solution further comprises a surfactant present in an amount effective to increase uniformity of reaction.

12. The process as defined in claim 1 in which said surfactant is present in an amount of from about 0.01 to about 5 g/L.

* * * * *